(12) United States Patent
Northrup

(10) Patent No.: US 11,102,921 B2
(45) Date of Patent: Aug. 24, 2021

(54) ELECTRICALLY TESTING CLEANLINESS OF A PANEL HAVING AN ELECTRONIC ASSEMBLY

(71) Applicant: IEC Electronics Corp., Newark, NY (US)

(72) Inventor: Mark Northrup, Rochester, NY (US)

(73) Assignee: IEC Electronics Corp., Newark, NY (US)

( * ) Notice: Subject to any disclaimer, the term of this patent is extended or adjusted under 35 U.S.C. 154(b) by 0 days.

(21) Appl. No.: 16/279,513

(22) Filed: Feb. 19, 2019

(65) Prior Publication Data

US 2020/0267880 A1 Aug. 20, 2020

(51) Int. Cl.
| | | |
|---|---|---|
| *G01R 31/28* | (2006.01) | |
| *H01L 21/66* | (2006.01) | |
| *H05K 13/08* | (2006.01) | |

(52) U.S. Cl.
CPC ....... *H05K 13/082* (2018.08); *G01R 31/2815* (2013.01); *H01L 22/12* (2013.01); *H01L 22/14* (2013.01); *H05K 13/083* (2018.08)

(58) Field of Classification Search
None
See application file for complete search history.

(56) References Cited

U.S. PATENT DOCUMENTS

| | | | | |
|---|---|---|---|---|
| 5,451,885 A | * | 9/1995 | Birch | G01R 31/2805 324/537 |
| 5,457,390 A | * | 10/1995 | Peterson | G01R 31/129 29/593 |
| 5,701,667 A | * | 12/1997 | Birch | G01R 31/2805 29/852 |
| 2013/0019904 A1 | * | 1/2013 | Becker | H05K 3/26 134/25.5 |
| 2016/0274060 A1 | * | 9/2016 | Denenberg | G01N 27/9046 |
| 2017/0350936 A1 | | 12/2017 | McMeen et al. | |

OTHER PUBLICATIONS

Advanced Circuits Inc., "Building a Printed Circuit Board," printed presentation, pp. 1-44, 2009.
The Institute of Printed Circuits, "How to Design and Specify Printed Circuits," pp. 1-92.
Kyzen Corp, Bixenman et al., "Cleaning Medical Electronics," pp. 1-58, ©2012, Sep. 18, 2012.

* cited by examiner

*Primary Examiner* — Jermele M Hollington
(74) *Attorney, Agent, or Firm* — Brian B. Shaw, Esq.; Harter Secrest & Emery LLP

(57) ABSTRACT

A method of assessing a cleanliness of an assembly in a panel during a manufacturing process is provided, wherein an electrical signal of at least one of a predetermined voltage, current or frequency is applied across a first subset and a second subset of nonconnected electrical contacts in a test coupon associated with the assembly, such that the first subset and the second subset have different pitches. In one configuration, the test coupon is tested at higher voltages, currents or frequencies to a point of failure or above a predetermined threshold.

18 Claims, 6 Drawing Sheets

ELECTRICALLY TESTING CLEANLINESS OF A PANEL HAVING AN ELECTRONIC ASSEMBLY

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

Field of the Invention

The present disclosure relates to assessing a cleanliness of a panel and particularly to assessing the cleanliness of an electronic assembly on the panel, wherein the assessed cleanliness can be used to monitor manufacturing parameters as well as assess the design of the electronic assembly and compatibility with the manufacturing process.

Description of Related Art

Much equipment typically includes at least one printed circuit board (PCB), wherein the PCB carries an integrated circuit. The integrated circuit is typically formed on a semiconductor substrate, the "die", which is packaged within an integrated circuit package. The package can be any of a variety of types such as metal packages with metal covers, ceramic packages, and plastic packages. The package also provides support for electrical leads or pads which allow the integrated circuit to make electrical connections to the printed circuit board. Thus, the integrated circuit is typically operably connected to the printed circuit board, which includes a substrate to which other electrical components are connected. The printed circuit board can further include traces or leads formed on or between layers of the printed circuit board. The assembly of the printed circuit board from the panel to retaining tens, if not hundreds, of electrical components requires extensive manufacturing processes including mechanical as well as electrical connection of the components to the panel.

These manufacturing processes can introduce contaminants into the resulting assembly. Because of the reduced dimensions of the electronic components and resulting printed circuit boards, the contaminants can lead to improper functioning of the printed circuit board or even failure at unpredictable times.

Therefore, a process is needed to assess the cleanliness of the manufacturing process as well as the ability of the available manufacturing process to assemble and clean the designed assembly. Historically, chemical analysis has been used to determine the cleanliness of the printed circuit board such as resistivity of solvent extract or even ion chromatography. However, these analyses require chemicals and can result in inaccurate results.

Therefore, a need exists for assessing a cleanliness of a panel or assembly without requiring chemical testing, wherein the cleanliness can be assessed before, during or after a manufacturing process.

BRIEF SUMMARY OF THE INVENTION

In one configuration, the present disclosure provides a method of assessing, by electrical testing, a cleanliness of a panel having an assembly as a portion of the panel, including the steps of passing the panel and a test coupon through, at least a portion of a manufacturing process, the test coupon having a plurality of nonconnected electrical contacts, wherein the plurality of nonconnected electrical contacts includes a first subset having a first pitch and a second subset having a different second pitch; applying a first electrical signal of at least one of a predetermined voltage, a predetermined current or a predetermined frequency between corresponding nonconnected electrical contacts in the first subset and measuring a first corresponding signal; applying a second electrical signal of at least one of a predetermined voltage, a predetermined current or a predetermined frequency between corresponding nonconnected electrical contacts in the second subset and measuring a second corresponding signal; and assessing the cleanliness of the assembly based on the measured first and second corresponding signal.

The method can further include applying each of an electrical signal of a predetermined voltage, a predetermined current and a predetermined frequency to corresponding nonconnected electrical contacts in both the first subset and the second subset and measuring a corresponding signal for each of the applied electrical signals.

Another method is provided for assessing, by electrical testing, a cleanliness of a panel having an assembly as a portion of the panel, including the steps of passing the panel and a test coupon through, at least a portion of a manufacturing process, the test coupon having a plurality of nonconnected electrical contacts, wherein the plurality of nonconnected electrical contacts includes a first subset at a first pitch; applying a first electrical signal of a predetermined voltage, a first electrical signal of a predetermined current and a first electrical signal of a predetermined frequency between corresponding nonconnected electrical contacts in the first subset and measuring a first corresponding signal from the applied first electrical signal of a predetermined voltage, a second corresponding signal from the applied first electrical signal of a predetermined current and a third corresponding signal from the applied first electrical signal of a predetermined frequency; and assessing the cleanliness of the assembly based on the measured first corresponding signal, the second corresponding signal and the third corresponding signal.

This method can further include the plurality of nonconnected electrical contacts having a second subset having a different second pitch and applying a second electrical signal of the predetermined voltage, a second electrical signal of the predetermined current and a second electrical signal of a predetermined frequency between corresponding nonconnected electrical contacts in the second subset and measuring a fourth corresponding signal from the applied second electrical signal of the predetermined voltage, a fifth corresponding signal from the applied second electrical signal of the predetermined current and a sixth corresponding signal from the applied second electrical signal of a predetermined frequency, and assessing the cleanliness of the assembly based on the measured first corresponding signal, the second corresponding signal, the third corresponding signal, the fourth corresponding signal, the fifth corresponding signal and the sixth corresponding signal.

An alternative method is provided for assessing, by electrical testing, a cleanliness of a panel having an assembly as a portion of the panel, through the steps of passing the panel and a test coupon through, at least a portion of a manufacturing process, the test coupon having a plurality of nonconnected electrical contacts, wherein the plurality of nonconnected electrical contacts includes a first subset having a first pitch; applying a first range of electrical signals across of one of predetermined voltages, predetermined currents or predetermined frequencies between corresponding nonconnected electrical contacts in the first subset and measuring corresponding signals to each of the first range of electrical signals; and assessing the cleanliness of the assembly based on the measured corresponding signals.

This method can further include applying a range of electrical signals across of each of predetermined voltages, predetermined currents and predetermined frequencies between corresponding nonconnected electrical contacts in the first subset, measuring a corresponding signals for each applied electrical signal in each range and assessing the cleanliness of the assembly based on the measured corresponding signals.

An additional method contemplates the plurality of nonconnected electrical contacts have a second subset at a different second pitch and the steps further include applying a range of electrical signals of each of predetermined voltages, predetermined currents and predetermined frequencies between corresponding nonconnected electrical contacts in the second subset, measuring a corresponding signal for each range of applied electrical signals to the second subset and assessing the cleanliness of the assembly based on the measured corresponding signals from the first subset and the second subset of the nonconnected electrical contacts.

Alternatively, the plurality of nonconnected electrical contacts includes a second subset at a different second pitch and the additional steps include applying a range of electrical signals of one of predetermined voltages, predetermined currents or predetermined frequencies between corresponding nonconnected electrical contacts in the second subset and measuring a corresponding signal for the range of applied electrical signals to the second subset of nonconnected electrical contacts; and assessing the cleanliness of the assembly based on the measured corresponding signals from the first subset and the second subset of the nonconnected electrical contacts.

BRIEF DESCRIPTION OF THE SEVERAL VIEWS OF THE DRAWING(S)

Figure 8:
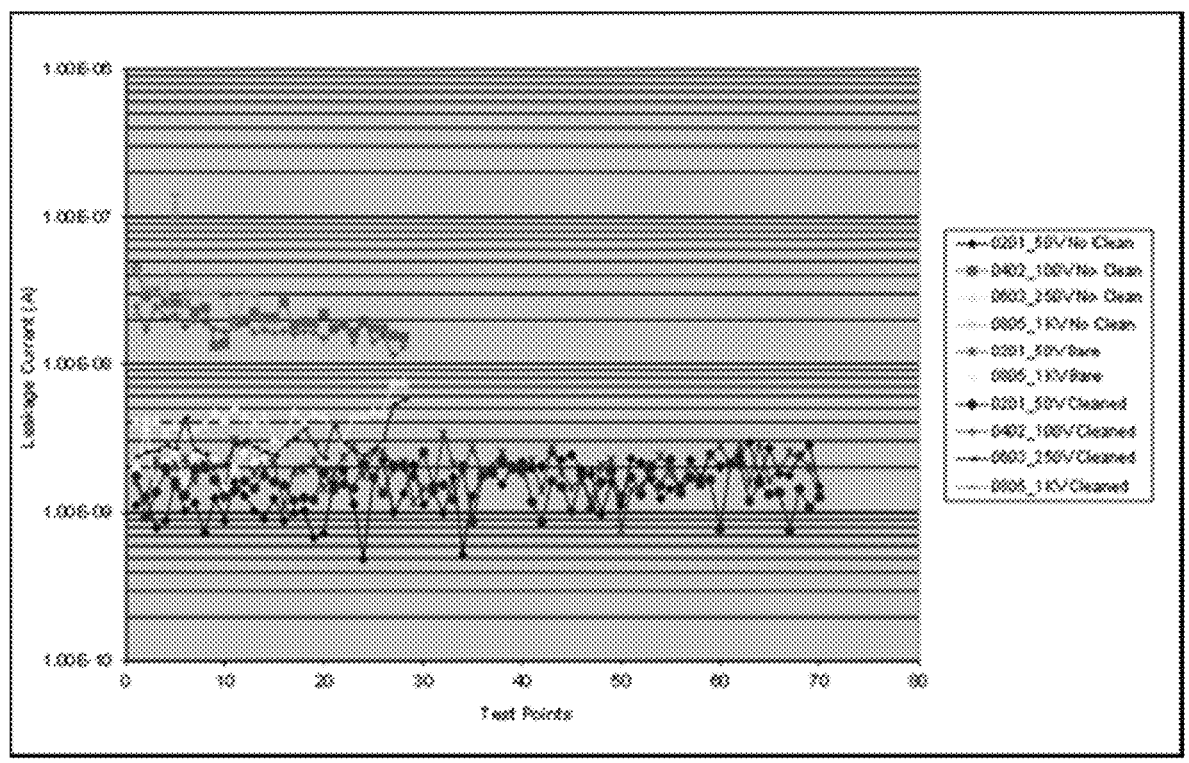

FIG. 8 is a representative graph of a measured signal corresponding to an applied test signal of a predetermined voltage to a test pattern having a higher pitch, the same pitch and a lower pitch than a functional component in the assembly; of a measured signal corresponding to an applied test signal of a predetermined current to a test pattern having a higher pitch, the same pitch and a lower pitch than a functional component in the assembly; and a measured signal corresponding to an applied test signal across a plurality of voltages to a test pattern having a given pitch.

DETAILED DESCRIPTION OF THE INVENTION

The present system and method provides for assessing a cleanliness of an assembly in a panel in conjunction with a manufacturing process.

Figure 1:
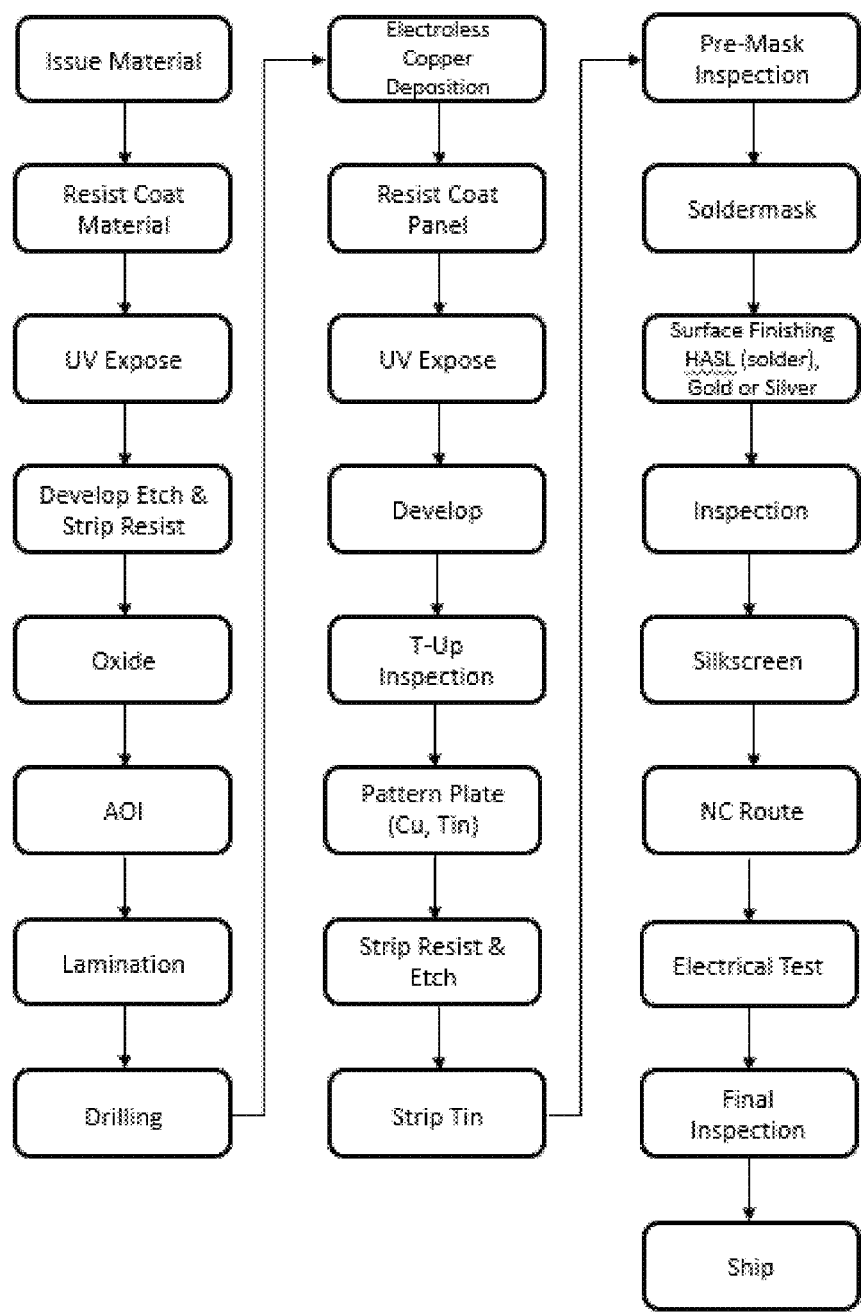
FIG. 1 is a flow chart of a representative manufacturing process.
Figure 2:
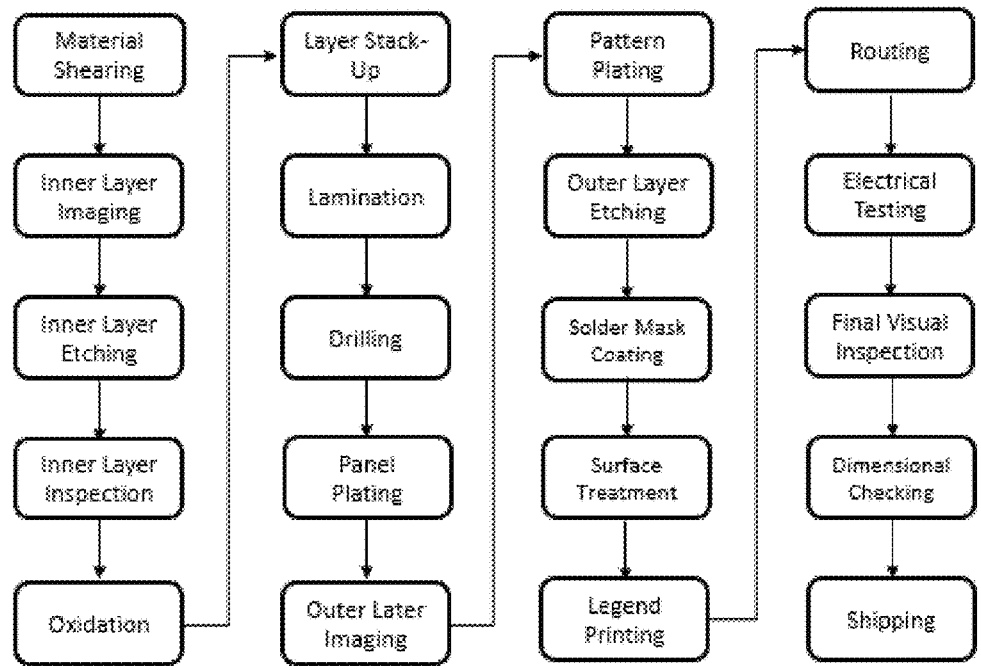
FIG. 2 is a flow chart of an alternative representative manufacturing process.

For purposes of the present description, the term "manufacturing process" means the process of converting raw materials or parts into finished goods or subassemblies that are subsequently incorporated into a finished good that is intended to meet the expectations or specifications of a customer or end user. The manufacturing process includes printing, trace formation, insertion, mounting and cleaning of an assembly or panel. Referring to FIG. 1, the manufacturing process can a multitude of steps or procedures, which typically provide for the formation of electrical traces or conductors on a substrate as well as creation of holes and vias. Additionally, as seen in FIG. 2, the manufacturing process can be directed to an assembly, wherein the electronic components are operably connected to the assembly. For thru-hole electronic components, the process includes the broad steps of (i) inserting the electronic components in the assembly, (ii) applying a flux, (iii) preheating the assembly, (iv) soldering and (v) cleaning.

For purposes of the present description, the term "electronic component" means any basic discrete device or physical entity in an electronic system used to affect electrons or their associated fields. The electronic component may be or have a number of electrical terminals or leads. Electronic components (e.g. capacitors, resistors or active devices) are generally soldered on the panel. The functional component, or component, is the actual electronic component that forms part of the assembly to provide for the operation of the assembly.

With respect the manufacturing processes, there may be unintended material, such as ionic material, encountered during or introduced from the manufacturing process that contaminates the assembly. Sources of the unintended material include contamination from organic compounds in process chemistries include plating baths and hot air solder leveling (HASL) flux chemistries for printed boards. Flux used for reballing, lead tinning and assembly can yield organic acid residues depending on flux composition as well as acetate, adipate, formate, maleate and succinate for example. These residual materials can adversely impact the performance of the resulting part or assembly. Thus, depending upon the manufacturing process being conforming or non-conforming with respect to an approved process, there can be analytes present or absent corresponding to the status of the process.

There are numerous processes for cleaning a completed or partially completed assembly. These cleaning processes include, but are not limited to (i) manual & benchtop cleaning by a variety of ways such as brushing, picking, washing with solvents; (ii) ultrasonic & batch Immersion cleaning processes which includes complete immersion the product being washed, so that the cleaning agent fully contacts the surface of the device and can be used in connection with either ultrasonic energy or spray-under-immersion (SUI) forces to circulate the fluid and apply mechanical energy to the substrate surface; (iii) vapor degreasing, wherein the vapor degreasing cleaning is integrated around an engineered solvent composition that dissolves (matches up) with the soil(s) being removed, (iv) inline aqueous spray-in-air cleaning process employing cleaning agents formulated for an Inline washer's combination of high flow, impact energy, and deflective forces; (iv) batch aqueous spray-in-air cleaning processes wherein the batch cleaning machines are designed to wash, rinse, and dry assemblies in a small footprint as groups of electronic assemblies are sealed inside a machine where they are typically washed, rinsed, and dried in a single main process chamber.

However, each of these processes requires at least one of a chemical agent or mechanical process which can vary, either by affirmative adjustment or drift from nominal. Thus, the efficacy of these cleaning processes can be a function of the status of the chemical agent, the mechanical processes as well as the design of the assembly.

The cleanliness is a measure of the presence of the unintended material on the panel introduced during or as a result of at least part of the manufacturing process. The unintended material is often ionic contamination sufficient to inhibit or preclude functioning of the resulting assembly in the intended manner or for the intended duration of operation. That is, the unintended material can create a tendency of the resulting assembly to conduct electricity between intended electrically insulated areas. Typical unintended materials include residual flux or solder. Similarly, the presence of the unintended material on the resulting assembly may be the result of manufacturing steps being outside of tolerances as well as ineffective or insufficient cleaning steps within the manufacturing process because of the design of the assembly.

Figure 3:
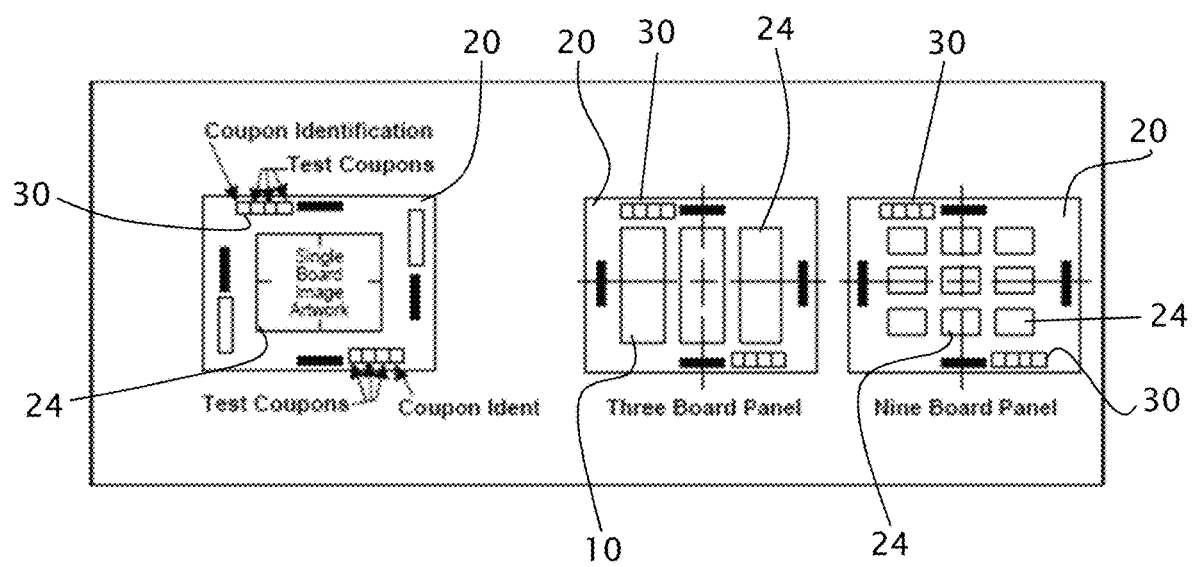
FIG. 3 is a top plan view of a variety of panel configurations having at least one assembly and a test coupon.

The term panel 20 means a substrate or base material upon which electronic components 10 are located. The panel 20 can include an area defining at least one assembly 24, often referred to as a printed circuit board (PCB) and one test coupon 30. Typically, the panel 20 can include a plurality of assemblies 24, such as 3, 4, 5, 6 or more, as seen in FIG. 3. The assembly 24 is the portion of the board to which electrical components will be attached or formed, thus often referred to as a printed circuit board (PCB). The panel 20, and particularly the assemblies 24 can include vias, through holes and traces or leads, along with attached components thus becoming the printed circuit board.

Advanced panels 20, and hence assemblies 24, may contain electronic components 10 embedded in the substrate of the panel. The panels 20 can be single sided (one copper layer), double sided (two copper layers) or multi-layer (outer and inner layers). Conductors on different layers are typically connected with vias. Panels 20 can be single layer or multi-layer depending on the intended configuration of the assembly. The panel 20 can be formed of any of a variety of materials known in the art, such as but not limited to FR4, standard rigid FR4, composite epoxy material CEM-3, or prepreg epoxy coated glass fabric.

As seen in FIG. 3, the test coupon 30 is typically located along a peripheral portion of the panel 20. However, it is understood the test coupon 30 can be located anywhere within the panel 20. The test coupon 30 can be integral with the panel 20 or can be separately formed and attached to the panel or can be a separate structure individually passed along at least a portion of the manufacturing process.

The test coupons 30 are typically relatively small in footprint, such as small PCBs approximately 200×30 mm with exactly the same layer and trace construction as the panel 20 and assemblies 24. For example, the test coupon 30 can include traces of the same line width and copper weight on the same layer as the controlled impedances on the assembly 24. In one configuration, the test coupon 30 is located so as to represent actual assembly conditions for plating, etching and lamination. Further, when artwork is produced for the assembly 24, the same aperture code used for the controlled impedance traces in the assembly is used to produce the test traces on the test coupon 30. The test coupon 30 is fabricated at the same time as the panel 20 (and assemblies 24), thus the test coupon will exhibit the same impedance as the assembly. For purposes of illustration in FIG. 3, the panel 20 is shown as a one up, having a single assembly 24 along with the test coupon, a three up panel having three assemblies along with the test coupon and a nine up panel having nine assemblies along with the test coupon located along a peripheral portion of the panel.

Figure 4:
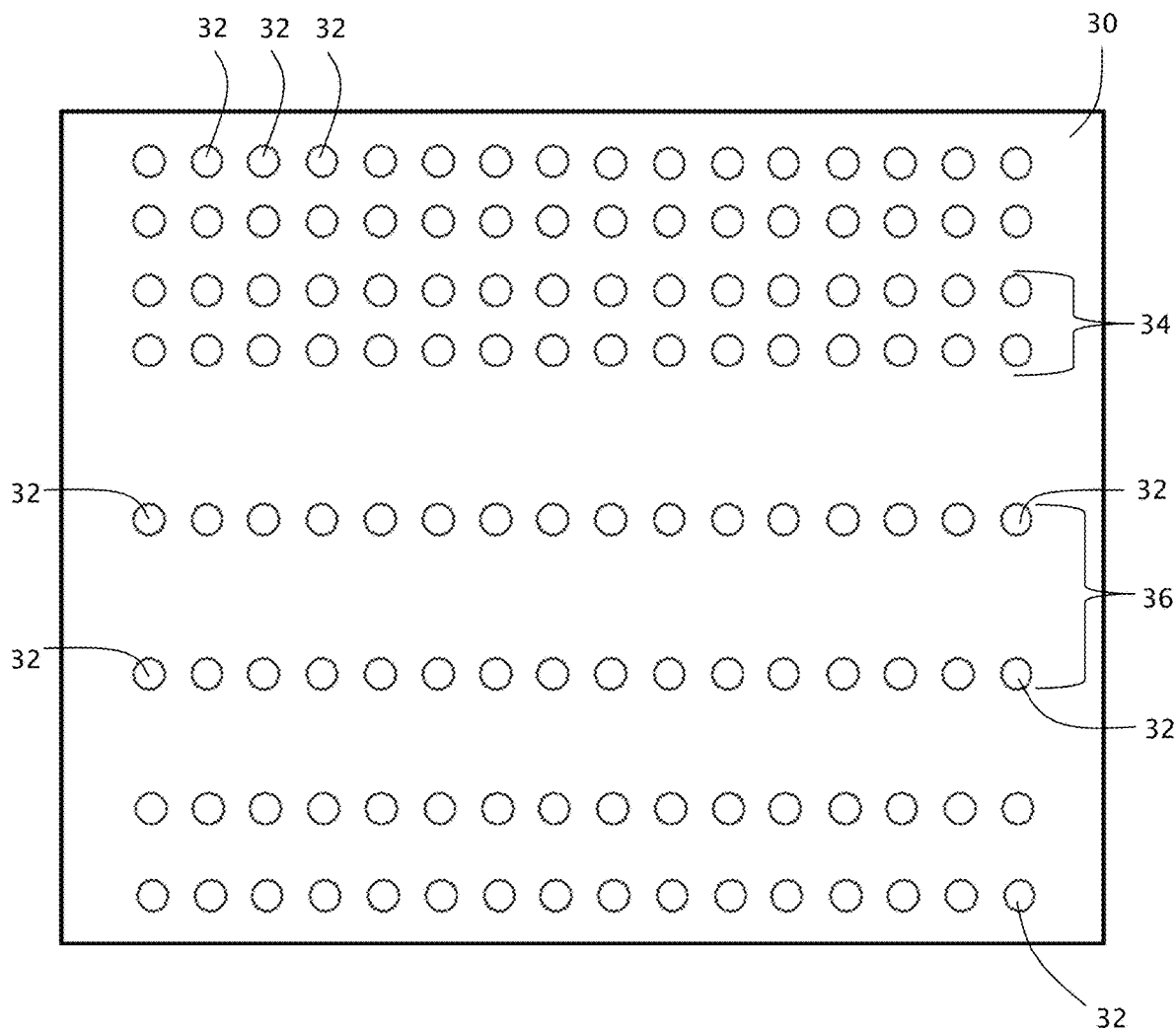
FIG. 4 is a top plan view of a first subset of nonconnected electrical contacts on the test coupon having a first pitch, a second subset of nonconnected electrical contacts on the test coupon having a second pitch and a third subset of nonconnected electrical contacts on the test coupon having a third pitch.

As seen in FIG. 4, the test coupon 30 also includes a plurality of nonconnected electrical contacts 32 disposed in a predetermined pattern. The nonconnected electrical contact 32 is a site which would make electrical continuity to an external conductor but is constructed as insulated from any electrical conductor in the panel 20. In one configuration, the nonconnected electrical contacts 32 are disposed in a regular grid array. The nonconnected electrical contacts 32 define a pitch, meaning the center-to-center spacing between contacts, wherein the electrical components such as conductors, such as pads and pins used in the assembly 24, also have a pitch. A higher (greater) pitch means more leads be linear dimension and the lower (smaller) pitch means fewer leads per linear dimension. The term fine pitch is used in the literature to refer to surface-mount components with a lead pitch of 25 mils or less. A further relevant dimension is an offset of the electronic component 10 to the plane of the panel 20 (assembly 24). That is, the distance or gap between a bottom of the component 10 and the surface of the panel 20 can impact the effectiveness of a cleaning step in the manufacturing process. As miniaturization continues, assemblies are designed with smaller standoffs. The smaller standoffs can even result in capillary force drawing flux residue between the components and the panel.

Figure 6:
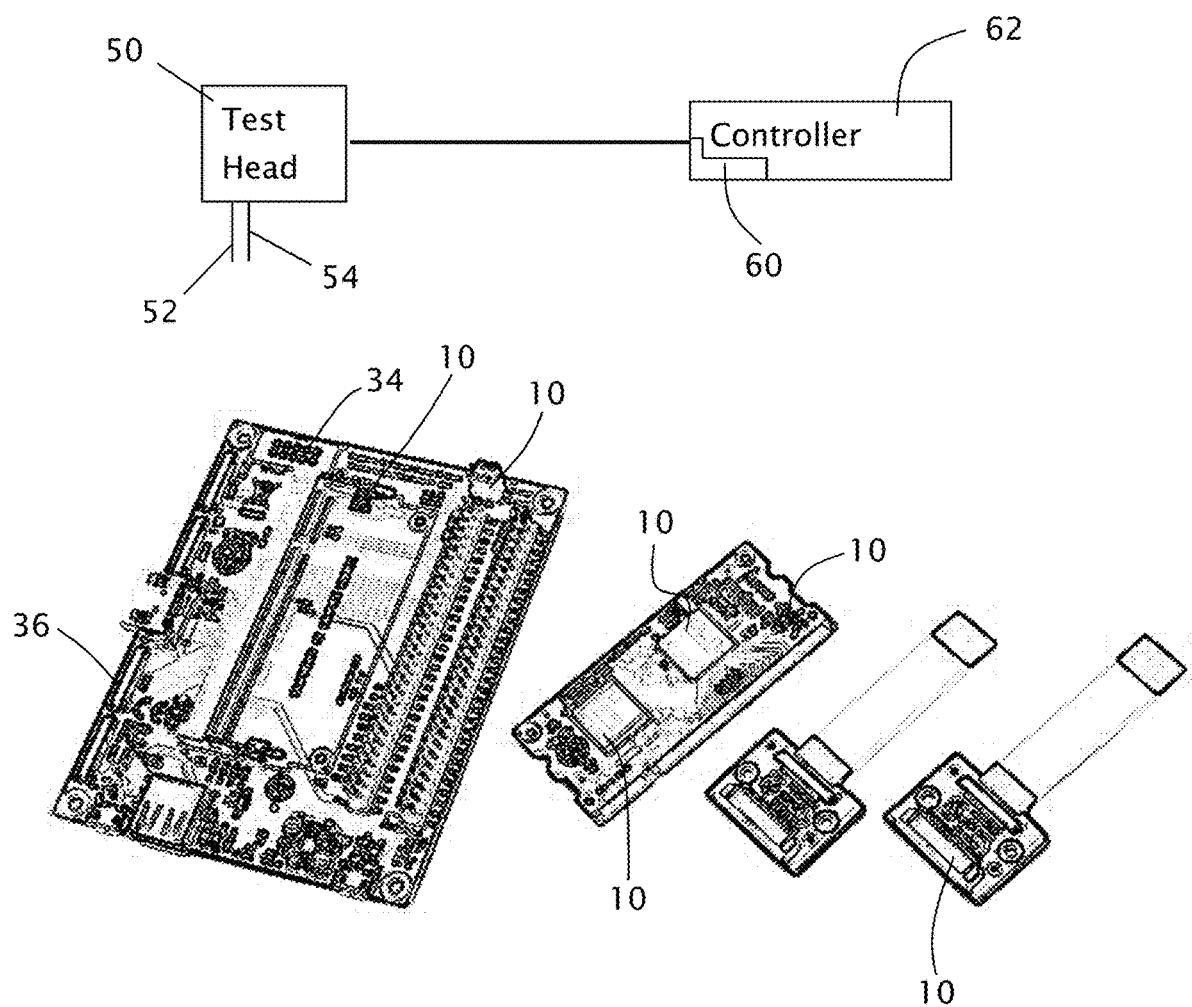
FIG. 6 is a representative test head for selectively applying a test signal to the test coupon and measuring a corresponding signal.

As seen in FIGS. 4 and 6, the test coupon 30 can include an array of nonconnected electrical contacts that define a first subset of nonconnected electrical contacts 34 having a first pitch (leads per distance) and a second subset of nonconnected electrical contacts having a different second pitch, wherein a straight line between a first member of the subset and a second member of the subset is continuous and uninterrupted by an intermediate nonconnected electrical contact. In a further configuration, the array of nonconnected electrical contacts 32 can be formed to provide a first, second, third, fourth and fifth pitches of the nonconnected electrical contacts. In certain configurations, the test coupon 30 includes nonconnected electrical contacts 32 defining five different pitches, wherein the pitches include one pitch equal to the pitch of the corresponding component on the assembly, a second pitch greater than the pitch of the component and a third pitch greater than the second pitch. The test coupon also includes a fourth pitch which is less than the pitch of the component and a fifth pitch which is less than the fourth pitch.

Referring to FIG. 4, in one configuration, the different pitches of the nonconnected electrical contacts 32 in the test coupon 30 are selected to provide a first subset having a pitch that is less than a pitch of a functional electrical component on the assembly 24, a second subset having a pitch equal to the pitch of the functional electrical component on the assembly and a third subset having a pitch that is greater (higher) than a pitch of the functional electrical component on the assembly. In select configurations, as set forth above, in addition to the subset of nonconnected electrical contacts 32 having a pitch equal to the functional component, there may be two different subsets of nonconnected electrical contacts having pitches less than the functional component of the assembly and two different subsets of nonconnected electrical contacts having pitches greater than the functional component of the assembly.

Figure 5:
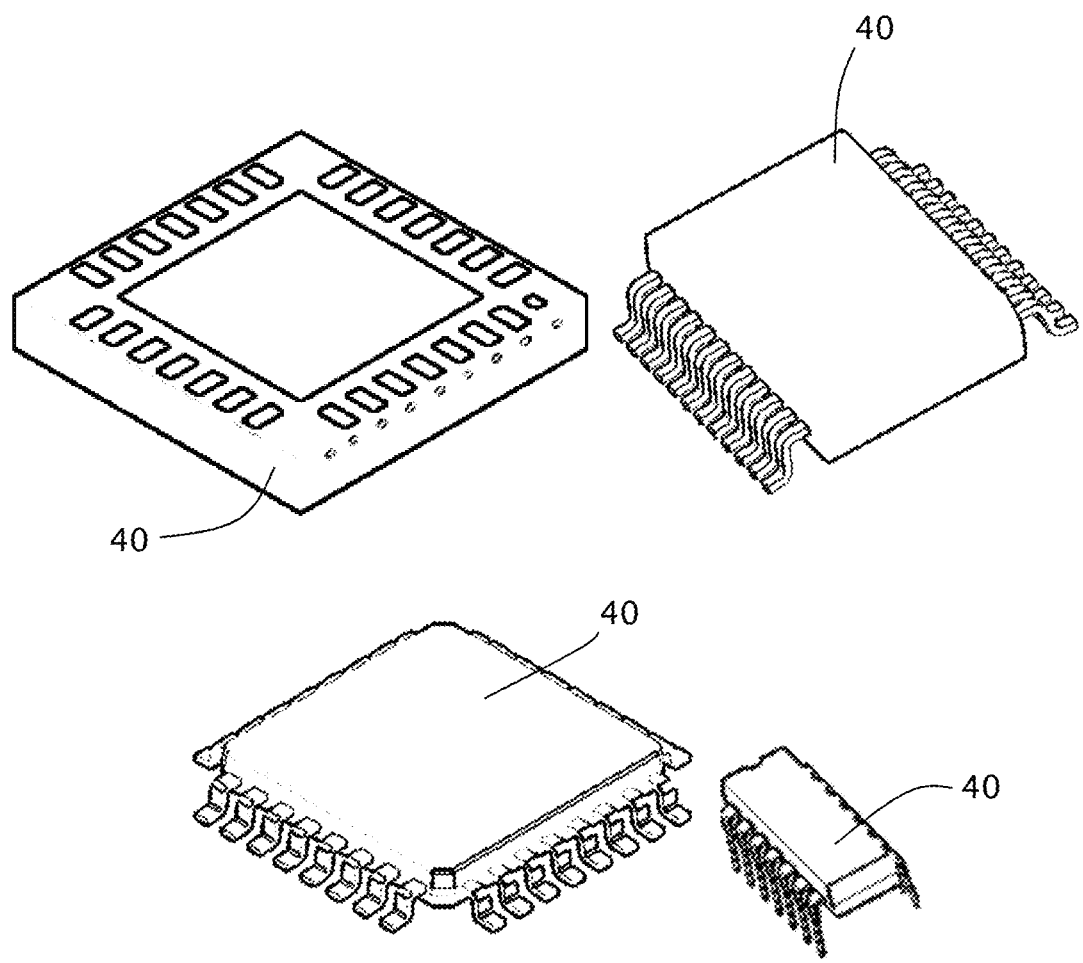
FIG. 5 is a perspective view of a set of dummy components for interconnection with the test coupon.

The test coupon 30 (sometimes referred to as a test vehicle) is a surrogate or proxy for the manufacturing of the assembly 24 (or panel 20) and the cleanliness of the assembly. The test coupon 30 is populated with dummy (mock) components 40 during the manufacturing process as corresponding functional components are installed on the assemblies 24. The dummy components 40, as seen in FIG. 5, are selected to be provide the same offset (Z-axis spacing) and pitch as a given functional component, and the test coupon 30 seeks to replicate with the dummy components the density and placement of the functional components, or least those functional components density and placing that is most likely to resist cleaning. The dummy components 40 are replica, non-electrical mechanical packages that can be used in pick-and-place machine setup, calibration and process testing. The array of nonconnected electrical contacts 32 in the test coupon 30 can include patterns of the type of designs employed in the assemblies, such as, but limited to, ball grid arrays (BGA), quad-flat no-leads (QFN), dual-flat no-leads (DFN), or surface-mount technology (SMT), as well as Chipscale, μBGA, CSP, Stacked CSP, Chip Array BGA, Ball Grid Array, TapeArray BGA, fleXBGA, SuperBGA, PBGA, fcCSP, Flip Chip Test Die, Quad Flat Pack, QFP, MLF, LQFP, TQFP, LQFP, BQFP, Ceramic Quad Flat Pack, CQFP, LCC, Small Outline, TSOP, TSSOP, SOIC, SOJ, SSOP, ePad, Plastic Leaded Chip Carrier, PLCC, SMR, SMC, SMC lead-free, SMT, SMR, SMTA, SME, melf diodes, through-hole, TO transistors, axial leaded resistors, passives and discrete as necessary to mimic the assembly. The dummy components 40 can have a lead configuration corresponding to or mimicking a functional component on the assembly 24, wherein the dummy component and the functional component have equivalent pitches. In some configurations, the dummy components 40 are connected to the test coupon 30 in a substantially similar manner that the functional components are connected to the panel in the assemblies. That, the dummy components 40 can have substantially the same footprint, pitch and offset as the functional components engaged with the assembly 24 of the panel 20. In one configuration, the dummy components 40 are operably connected to the test coupon 30 at the same processing step as the corresponding functional component. Further, it is advantageous for the dummy component 40 to be operably connected to the test coupon 30 by the same process as the corresponding functional component 10. Thus, the connected dummy component 40 provides a proxy for the connection of the functional component to the assembly 24/panel 20, without requiring measuring the assemblies or functional components.

It is also contemplated the test coupon 30 can include dummy components 40 of larger and smaller footprint than the functional components 10, so that the electrical testing can identify the limits of the available cleaning steps and hence determine a yield of the manufacturing process for the corresponding design.

Therefore, by assessing the cleanliness of the panel 20 (including a proxy for the assembly) during the manufacturing process, the manufacturer can determine if the cleaning is sufficient, whether the design is within the capability of the manufacturing process; whether the manufacturing parameters have drifted and whether chemicals in the process have degraded or weakened.

For example, testing at each step of the manufacturing process allows a manufacturer to control the manufacturing process in real time, thereby reducing waste from materials incorporated into faulty product.

Assessing the cleanliness is done by passing an electrical signal having at least one of a predetermined voltage, predetermined current or predetermined frequency, or a range of voltages, currents or frequencies between nonconnected electrical contacts 32 in the test coupon 30. As the nonconnected electrical contacts 32 are initially electrically isolated, there should be infinite impedance (resistance) between the nonconnected electrical contacts of the test coupon 30 and hence no electrical conductivity between the tested nonconnected electrical contacts. Thus, for a given applied signal between nonconnected electrical contacts 32 of the test coupon 30, there should be no measured corresponding signal. However, as the applied voltage, current or frequency increases, a measured corresponding signal appears and can increase linearly with the applied signal or non-linearly with the applied signal. The satisfactory or acceptable levels of the measured corresponding signal can be set by performance data of the completed assembled or by "jumps" in the corresponding signal. As seen in FIG. 8, there may be some leakage that can occur, yet still have the assembly 24 or panel 20 or manufacturing step be compliant. For example, if the applied electrical signal has a current or voltage that is a sufficient multiple of the intended operating parameters, such as 1.5×, 2×, 5× or 10×, before there is material leakage, then the assembly 24 or manufacturing process may still be deemed compliant even though leakage occurred.

Figure 7:
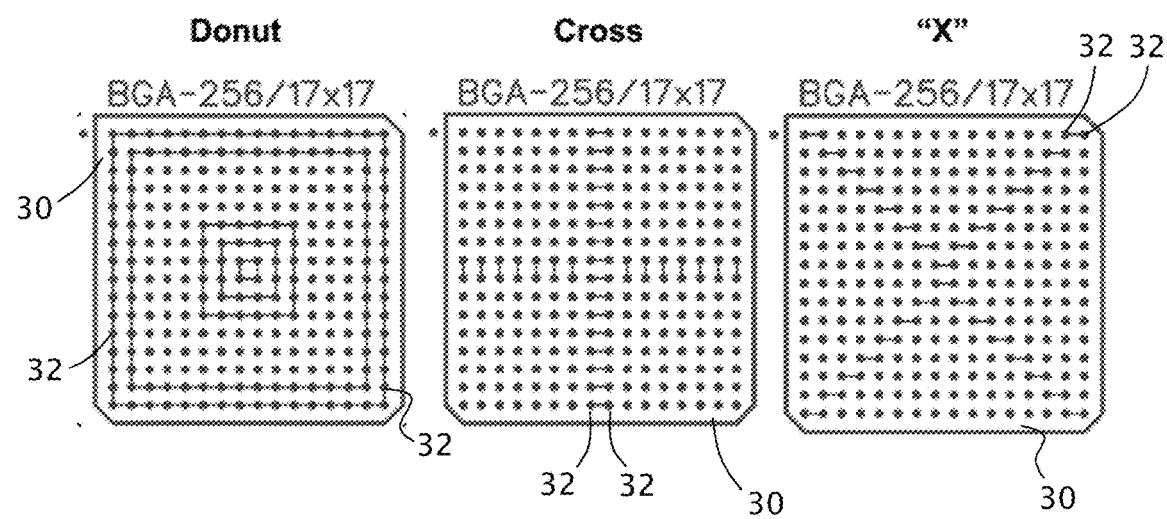
FIG. 7 is a series of test patterns for testing select nonconnected electrical contacts of the test coupon.

Depending on the specific pattern of tested nonconnected electrical contacts 32 in the test coupon 30 with the specific electrical signals, the present assessing can identify whether the current manufacturing process is capable of meeting a current design for the assembly in the panel 20 as well as whether the manufacturing steps are compliant. As seen in FIG. 7, the pattern of tested nonconnected electrical contacts 32 can be selected to correspond to the geometries on the assembly 24, so that the tested portions of the test coupon 30 function as a proxy for the functional aspects of the assembly. Thus, portions of the assembly 24 can be identified as noncompliant or likely to fail (including prematurely). In addition, the test coupon 30 can include the dummy components 40 having the same offset, a smaller offset and a larger offset than the component 10 on the assembly 24. Thus, by testing the nonconnected electrical contacts 32 exposed to the offset of the dummy components 40, the present system can identify by the corresponding signal being above a threshold or exhibiting a step or jump, those components most likely to fail. Thus, again the portions of the assembly 24 having the greatest contamination can be identified by testing the test coupon 30.

Referring to FIG. 6, a representative test head 50 having a plurality of electrical leads 52, 54 for applying a predetermined electrical signal of the predetermined voltage, predetermined current or predetermined frequency and measuring a corresponding signal from or between the nonconnected electrical contacts 32 is shown. The test head 50 includes or is connected to a signal generator 60 known in the art for producing an electrical signal of a predetermined voltage, predetermined current or predetermined frequency as well as electrical signals across a predetermined range of voltages, currents or frequencies. The signal generator 60 can be operably connected to or incorporated within a controller 62.

The testing can be performed on each test coupon 30 or a sampling—at each step along the manufacturing process (after formation of the nonconnected electrical contacts), at select steps in the manufacturing process or only after the manufacturing process. For example, in select configurations, a sampling of test coupons 30 can be tested after each step, at selected points in the manufacturing process or after the manufacturing process. That is, 1 out 5, 10, 20 or 100 (or any desired sampling rate) test coupons 30 (and hence panels 20) can be tested at the above points relative to the manufacturing process.

In the testing for example, by passing the electrical signal of a predetermined voltage, predetermined current or predetermined frequency between nonconnected electrical contacts 32 having a pitch that is higher (more leads/distance) than the pitch of the functional component 10 installed on the panel, if there is no leakage (or leakage only below an acceptable threshold), then it can be assumed the functional component with the lower pitch (less leads/distance), and hence assembly, will not experience detrimental effects with respect to cleanliness. Conversely, if the tested nonconnected electrical contacts 32 having a lower pitch (less leads/distance) than the functional component 10 exhibit leakage (or leakage above a threshold), then it can be assessed that the manufacturing process (or desired design) is not meeting tolerances and the assembly 24 will likely experience failure or an operation outside of design parameters.

Further, by testing with the electrical signal of one of a predetermined voltage, predetermined current and/or predetermined frequency, at pitches less than and greater than the relevant functional component, the present system can identify which pitches are satisfactory within the manufacturing process. For example, if there is leakage at an electrical signal having a given predetermined voltage or current at a given pitch, it can be assumed that any higher pitch will experience failure or noncompliance with design parameters. Conversely stated, if the manufacturing process is operating to specifications and the resulting test coupon shows passage or compliance at a given pitch, then it can be assumed, that any electrical component 10 on the assembly 24 having a lower pitch and larger standoff will be functional in the assembly.

Further, the present system includes the ability to apply the electrical signal of the predetermined voltage, current and/or frequency to the test coupon at (i) select steps along the manufacturing process or (ii) each step along the manufacturing process. Thus, the efficacy of the manufacturing process can be assessed at each step in real time. For example, if the step is a washing or cleaning step employing a chemical, and a failing pitch decreases, then the efficacy of the step (such as the employed chemical wash) may be weakening. Similarly, if the failing pitch decreases and there is no issue with the cleaning step, then there may be an issue with the installation of the functional components. As seen in FIG. 8, the measured signals provide an indication of the compliance of the tested pitch or offset of the test coupon 30.

Referring to FIG. 8, a plot of leakage current to test voltage range (50V, 100V, 250V and 1 kV) is shown for a first, second and third spacing (pitch) of the tested nonconnected electrical contacts, wherein tested pitches are higher than, equal to and less than the pitch of the dummy component. From FIG. 8, it can be seen that for all tested spacings of the nonconnected electrical contacts 32, a leakage current of $1.0 \times 10^{-6}$ A across a test range of 50V, 100V, 250V and 1 kV may indicate passage or compliance of the manufacturing process. As further shown in FIG. 8, the spacing of sample 0201, a leakage current of $1.0 \times 10^{-8}$ A across a test range of 50V, 100V, 250V and 1 kV indicates passage or compliance of the manufacturing process. From FIG. 8, it can be seen that for the spacing of sample 0402, a leakage current of $1.0 \times 10^{-6}$ A across a test range of 50V, 100V, 250V and 1 kV indicates passage or compliance of the manufacturing process.

Thus, FIG. 8 provides a representative graph of a measured signal corresponding to an applied test signal of a predetermined voltage to a test pattern having a higher pitch, the same pitch and a lower pitch than a functional component in the assembly; a representative graph of a measured signal corresponding to an applied test signal of a predetermined current to a test pattern having a higher pitch, the same pitch and a lower pitch than a functional component in the assembly; and a measured signal corresponding to an applied test signal across a plurality of voltages to a test pattern having a given pitch.

Alternatively, referring to FIG. 8, a different value can be predetermined for assessing the compliance of a board 20, such as $1.25 \times 10^{-9}$ A.

As these electrical tests can be done in real time and prior to completion of the manufacturing process, substantial efficiencies can be obtained as the manufacturing process can be corrected or adjusted in real time—thereby avoiding the investment in manufacturing steps and materials that only result in failed assemblies. By assessing the cleanliness, the capability and status of the manufacturing process can be "measured" as well as the compatibility or ability of the manufacturing process to construct the designed panel (assemblies). The electrical testing allows the identification of where in the manufacturing process the cleaning is insufficient or incapable of removing the contaminants.

By employing at least one and in select configurations electrical signals of all three of the predetermined voltage, the predetermined current and the predetermined frequency (or ranges of these signals), the performance of the test coupon (and hence functional components), can be more accurately assessed. That is, while the predetermined voltage may indicate the assembly is in compliance (or passing), under the frequency test the assembly may not be in compliance. That is, as a certain frequency of the electric signal is applied between nonconnected electrical contacts, the measured signal may indicate failure or noncompliance.

Specifically, even if each tested location on the test coupon 30 passes each signal in the predetermined voltage range, upon applying the predetermined range of frequencies to the locations on the test coupon, such as from 1 gigahertz to 40 gigahertz (or more), upon a failure under the frequency testing, the present testing can identify those locations of the assembly that are less clean. The higher the frequency tested without leakage, the cleaner the area of the test coupon 30. Thus, a failure at a given frequency at a given location identifies that location as less clean than an adjacent location that did not fail at the frequency. Similarly, an area of the test coupon 30 that may not show any leakage across the range of applied frequencies, may show leakage at a given current or within a range of currents. The higher the applied current without leakage, the cleaner the tested area. Again, if an area of the test coupon 30 passes the predetermined voltage (or range) or frequency (or range), but fails at a particular current, then it is known that that portion is less clean and more likely to fail in the future.

The predetermined frequencies can be used to measure a variety of parameters including, but not limited to parasitic capacitance, controlled impedance, controlled inductance, frequency shift, signal gain or loss, phase shift or change as well as scattering parameters. Each of these parameters can be used to assess the cleanliness with respect to the parameter being above or below a predetermined threshold, depending on the desired or required cleanliness.

In combination with the assembly design and manufacturing processes, the capability of a manufacturing process for a given design can be assessed in terms of likely to fail from otherwise undetected contamination.

That is, assembly 24 design impacts the efficacy of the manufacturing process, including the cleaning steps. For example, following factors often impact the manufacturing (and hence cleaning process): the size of a component and offset; the solder mask definition, the solder paste selection from available pastes, the placement and density of the components on local regions of the assembly as well as required heat to solder components.

The present electrical testing allows the identification of those portions of the assembly 24 that are hardest to clean (or most resistant to the available cleaning steps) and hence most likely to exhibit the highest failure rate. For example, the nonconnected electrical contacts 32 of the test coupon 30 can be subjected to test patterns for ranges of voltage, current and frequency that extend from no leakage (or passing) to failure so that it can be determined from the pass to failure thresholds what aspects of the assembly design are likely to be free from manufacturing defects and which aspects of the assembly design are likely to fail. From these thresholds, future assembly designs can be made to within the capability of the manufacturing process, thereby improving the yield of the manufacturing process.

Thus, the present system can subject the test coupon 30 to testing at one of a predetermined voltage, a predetermined current and a predetermined frequency across at least two different pitches, where preferably one pitch is higher (more leads per inch) than the dummy component and hence the functional component. Depending on the degree to which the tested pitch is greater than the functional component, a confidence of operation can be assigned to the assembly 24.

Alternatively, each of the electrical signal of a predetermined voltage, the electrical signal of a predetermined current and the electrical signal of a predetermined frequency can be applied to a given pitch of the nonconnected electrical contacts 32 of the test coupon 30, wherein the measured signal must be a passing value for each of the three electrical signals.

Similarly, each of the electrical signal of a predetermined voltage, the electrical signal of a predetermined current and the electrical signal of a predetermined frequency can be applied to a first subset and a second subset of the nonconnected electrical contacts 32 of the test coupon 30, wherein the measured signals for each of the applied electrical signals to each of the subsets must be a passing value for each of the three electrical signals.

In a further configuration, one of the voltage, the current or the frequency of the electrical signal is varied through a range as it is applied across a range of values for a given pitch of the nonconnected electrical contacts 32 of the test coupon 30. In one configuration, the electrical signal is varied from less than, or at least, the operating value of the signal in the functional component (or a known passing value) to a higher value. Depending on the anticipated use of the assembly 24 or the intended confidence in operation of the assembly, a satisfactory measured signal for the higher value of the applied electrical signal would indicate an increased confidence in the operation of the assembly.

In another configuration, one of the voltage, the current or the frequency of the electrical signal is varied through a range as it is applied across (i) a first subset 34 having a first pitch of the nonconnected electrical contacts 32 of the test coupon 30 and (ii) a second subset 36 having a second pitch of the nonconnected electrical contacts of the test coupon. In one configuration, the electrical signal is varied from less than, or at least, the operating value of the signal in the functional component (or a known passing value) to a higher value. Depending on the anticipated use of the assembly 24 or the intended confidence in operation of the assembly, a satisfactory measured signal for the higher value of the applied electrical signal would indicate an increased confidence in the operation of the assembly.

It is further contemplated that a range of each of the voltage, the current and the frequency of the electrical signal is applied across a given pitch of the nonconnected electrical contacts 32 of the test coupon 30. In one configuration, the electrical signal is varied from less than, or at least, the operating value of the signal in the functional component (or a passing value) to a higher value. Depending on the anticipated use of the assembly 24 or the intended confidence in operation of the assembly, a satisfactory measured signal for the higher value of the applied electrical signal would indicate an increased confidence in the operation of the assembly.

It is also understood, a range of each of the voltage, the current and the frequency of the electrical signal can be applied across a first subset 34 of the nonconnected electrical contacts 32 having a first pitch and a second subset 36 of the nonconnected electrical contacts having a different second pitch in the test coupon. In one configuration, the electrical signal for each subset is varied from less than, or at least, the operating value of the signal in the functional component (or a passing value) to a higher value. Depending on the anticipated use of the assembly 24 or the intended confidence in operation of the assembly, a satisfactory measured signal for the higher value of the applied electrical signal would indicate an increased confidence in the operation of the assembly.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A method of assessing, by electrical testing, a cleanliness of a panel having an assembly as a portion of the panel, the method comprising:
   (a) passing the panel and a test coupon through, at least a portion of a manufacturing process, the test coupon having a plurality of nonconnected electrical contacts which are electrically insulated from each other, wherein the plurality of nonconnected electrical contacts includes a first subset having a first pitch and a second subset having a different second pitch;
   (b) applying a first electrical signal of at least one of a predetermined voltage, a predetermined current or a predetermined frequency between corresponding nonconnected electrical contacts in the first subset and measuring a first corresponding signal;

(c) applying a second electrical signal of at least one of a predetermined voltage, a predetermined current or a predetermined frequency between corresponding nonconnected electrical contacts in the second subset and measuring a second corresponding signal; and (d) assessing the cleanliness of the assembly based on the measured first and second corresponding signal.

2. The method of claim 1, wherein the second pitch is higher than the first pitch.

3. The method of claim 1, further comprising applying each of an electrical signal of a predetermined voltage, a predetermined current and a predetermined frequency to corresponding nonconnected electrical contacts in both the first subset and the second subset and measuring a corresponding signal for each of the applied electrical signals.

4. The method of claim 1, wherein the test coupon is detachable from the panel.

5. The method of claim 1, wherein the test coupon is physically connected to the panel.

6. The method of claim 1, wherein the test coupon is integral with the panel.

7. The method of claim 1, wherein applying at least one of the predetermined voltage, a predetermined current or a predetermined frequency to the first subset includes applying the at least one of the predetermined voltage, a predetermined current or a predetermined frequency to a predetermined pattern of the plurality of nonconnected electrical contacts.

8. The method of claim 1, further comprising applying at least one of the predetermined voltage, a predetermined current or a predetermined frequency to a third subset of the plurality of nonconnected electrical contacts, wherein the third pitch is higher than the second pitch and applying at least one of the predetermined voltage, a predetermined current or a predetermined frequency to a fourth subset at a fourth pitch higher than the third pitch.

9. The method of claim 1, further comprising interconnecting a functional component with the assembly; interconnecting a dummy component with the test coupon, wherein the functional component and the dummy component have a given lead pitch and the first pitch is lower than the given lead pitch and the second pitch is higher than the given lead pitch.

10. The method of claim 1, wherein the manufacturing process includes at least one cleaning step.

11. The method of claim 1, wherein assessing the cleanliness of the assembly is based on (i) the measured first corresponding signal relative to a first threshold valve and (ii) the second corresponding signal relative to a second threshold value.

12. The method of claim 1, further comprising mounting a dummy component to the test coupon, wherein the dummy component has the same footprint as a functional component in the assembly.

13. A method of assessing, by electrical testing, a cleanliness of a panel having an assembly as a portion of the panel, the method comprising:
(a) passing the panel and a test coupon through, at least a portion of a manufacturing process, the test coupon having a plurality of nonconnected electrical contacts which are electrically insulated from each other, wherein the plurality of nonconnected electrical contacts includes a first subset at a first pitch;
(b) applying a first electrical signal of a predetermined voltage, a first electrical signal of a predetermined current and a first electrical signal of a predetermined frequency between corresponding nonconnected electrical contacts in the first subset and measuring a first corresponding signal from the applied first electrical signal of a predetermined voltage, a second corresponding signal from the applied first electrical signal of a predetermined current and a third corresponding signal from the applied first electrical signal of a predetermined frequency; and
(c) assessing the cleanliness of the assembly based on the measured first corresponding signal, the second corresponding signal and the third corresponding signal.

14. The method of claim 13, wherein the plurality of nonconnected electrical contacts includes a second subset having a different second pitch and further comprising applying a second electrical signal of the predetermined voltage, a second electrical signal of the predetermined current and a second electrical signal of a predetermined frequency between corresponding nonconnected electrical contacts in the second subset and measuring a fourth corresponding signal from the applied second electrical signal of the predetermined voltage, a fifth corresponding signal from the applied second electrical signal of the predetermined current and a sixth corresponding signal from the applied second electrical signal of a predetermined frequency, and assessing the cleanliness of the assembly based on the measured first corresponding signal, the second corresponding signal, the third corresponding signal, the fourth corresponding signal, the fifth corresponding signal and the sixth corresponding signal.

15. A method of assessing, by electrical testing, a cleanliness of a panel having an assembly as a portion of the panel, the method comprising:
(a) passing the panel and a test coupon through, at least a portion of a manufacturing process, the test coupon having a plurality of nonconnected electrical contacts which are electrically insulated from each other, wherein the plurality of nonconnected electrical contacts includes a first subset having a first pitch;
(b) applying a first range of electrical signals across of one of predetermined voltages, predetermined currents or predetermined frequencies between corresponding nonconnected electrical contacts in the first subset and measuring corresponding signals to each of the first range of electrical signals; and
(c) assessing the cleanliness of the assembly based on the measured corresponding signals.

16. The method of claim 15 further comprising applying a range of electrical signals across of each of predetermined voltages, predetermined currents and predetermined frequencies between corresponding nonconnected electrical contacts in the first subset, measuring a corresponding signals for each applied electrical signal in each range and assessing the cleanliness of the assembly based on the measured corresponding signals.

17. The method of claim 16, wherein the plurality of nonconnected electrical contacts includes a second subset at a different second pitch and further comprising applying a range of electrical signals of each of predetermined voltages, predetermined currents and predetermined frequencies between corresponding nonconnected electrical contacts in the second subset, measuring a corresponding signal for each range of applied electrical signals to the second subset and assessing the cleanliness of the assembly based on the measured corresponding signals from the first subset and the second subset of the nonconnected electrical contacts.

18. The method of claim 15, wherein the plurality of nonconnected electrical contacts includes a second subset at a different second pitch and further comprising applying a range of electrical signals of one of predetermined voltages, predetermined currents or predetermined frequencies between corresponding nonconnected electrical contacts in the second subset and measuring a corresponding signal for the range of applied electrical signals to the second subset of nonconnected electrical contacts; and assessing the cleanliness of the assembly based on the measured corresponding signals from the first subset and the second subset of the nonconnected electrical contacts.

\* \* \* \* \*